(12) United States Patent
Shinomiya et al.

(10) Patent No.: US 7,521,352 B2
(45) Date of Patent: Apr. 21, 2009

(54) METHOD FOR MANUFACTURING A SEMICONDUCTOR DEVICE

(75) Inventors: Hideo Shinomiya, Yokohama (JP); Jun Hirota, Yokohama (JP); Mie Matsuo, Kamakura (JP); Hisashi Kaneko, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/790,723

(22) Filed: Apr. 27, 2007

(65) Prior Publication Data

US 2007/0254474 A1 Nov. 1, 2007

(30) Foreign Application Priority Data

Apr. 28, 2006 (JP) ............................. 2006-126946

(51) Int. Cl.
*H01L 21/4763* (2006.01)

(52) U.S. Cl. ...................... 438/622; 438/637; 438/687; 438/688; 257/E23.142; 257/E23.143; 257/E21.579; 257/E21.585

(58) Field of Classification Search ................. 438/618, 438/622, 627, 637, 641, 650, 686–688, 587, 438/638, 975, FOR. 435; 257/E23.142, E23.143, 257/E21.577, E21.579, E21.585, E21.586
See application file for complete search history.

(56) References Cited

U.S. PATENT DOCUMENTS

| 6,492,734 | B2 | 12/2002 | Watanabe | |
| 6,689,681 | B2 | 2/2004 | Watanabe | |
| 6,737,345 | B1 * | 5/2004 | Lin et al. | 438/601 |
| 2004/0259035 | A1 * | 12/2004 | Greco | 430/311 |

FOREIGN PATENT DOCUMENTS

JP 11-330236 11/1999

* cited by examiner

*Primary Examiner*—Brook Kebede
(74) *Attorney, Agent, or Firm*—Finnegan, Henderson, Farabow, Garrett & Dunner, L.L.P.

(57) ABSTRACT

A method for manufacturing a semiconductor device includes forming a copper anti-diffusion film on a copper trench wiring layer, and forming an opening portion in the copper anti-diffusion film by laser ablation, the opening portion being formed in a region corresponding to an alignment region used for lithography process for forming an aluminum wiring on the copper trench wiring layer.

12 Claims, 5 Drawing Sheets

METHOD FOR MANUFACTURING A SEMICONDUCTOR DEVICE

CROSS-REFERENCE TO RELATED APPLICATIONS

This application is based upon and claims the benefit of priority from prior Japanese Patent Application No. 2006-126946, filed Apr. 28, 2006, the entire contents of which are incorporated herein by reference.

BACKGROUND OF THE INVENTION

1. Field of the Invention

The present invention relates to a method for manufacturing a semiconductor device comprising a multilayer wiring layer including a copper trench wiring layer and aluminum wiring formed thereon.

2. Description of the Related Art

A non-volatile semiconductor memory is given as one of semiconductor memory devices. Recently, the non-volatile semiconductor memory has come to wide use as a device for storing data. Typically, a NAND type flash memory has known as an electrically rewritable non-volatile memory using a floating gate electrode.

As the NAND type flash memory has the advantage of scale-down, its storage capacity is increasing. Currently, in the NAND type flash memory, a multilayer wiring including a wiring formed of aluminum as a main component (Al wiring) is used. The lower layer of Al wiring and the upper layer of Al wiring are connected via a plug formed of Al as a main component (Al plug).

This kind of Al wiring and Al plug are formed the following process (Jpn. Pat. Appln. KOKAI Publication No. 11-330236).

First, an interlayer insulating film is formed on the lower-layer Al wiring. Thereafter, a resist pattern for forming a connection hole (via hole) is formed on the interlayer insulating film.

Next, the interlayer insulating film is etched using the resist pattern as a mask, and thereby, the connection hole is formed.

Next, an Al film is formed on the entire surface by reflow sputtering process. The connection hole is filled with the Al film.

Next, a resist pattern is formed on the Al film, the Al film is etched using the resist pattern as a mask, and thereby, an Al plug comprising the Al film and the upper-layer al wiring are formed.

It is expected that the scale-down of the NAND type flash memory advances. In this case, the present Al wiring has large resistance. For this reason, it is expected that a multilayer wiring including a wiring formed of copper as a main component (Cu wiring) is used. However, the process of the NAND type flash memory comprising a multilayer wiring including Cu wiring has not been known thus far.

BRIEF SUMMARY OF THE INVENTION

According to an aspect of the present invention, there is provided a method for manufacturing a semiconductor device comprising: forming a copper anti-diffusion film on a copper trench wiring layer; and forming an opening portion in the copper anti-diffusion film by laser ablation, the opening portion being formed in a region corresponding to an alignment region used for lithography process for forming an aluminum wiring on the copper trench wiring layer.

According to another aspect of the present invention, there is provided a method for manufacturing a semiconductor device comprising: forming a copper anti-diffusion film on a copper trench wiring layer, the copper trench wiring layer comprising a first insulating film and a copper wiring formed in the first insulating film; forming a first opening portion in the copper anti-diffusion film by laser ablation; forming a second insulating film on the copper anti-diffusion film and the first opening portion; form a second opening portion reaching a rear surface of the first insulating film from a surface of the second insulating film via the first opening portion and forming a third opening portion in the second insulating film on the copper wiring by etching the second and first insulating films successively; forming a connection hole to the copper trench wiring layer in the second insulating film and the copper anti-diffusion film by etching the copper anti-diffusion film under a bottom of the third opening portion; forming an aluminum film to be processed into an aluminum wiring and an aluminum plug on the connection hole, the second opening portion and the second insulating film so that a concave portion is formed on a surface of the aluminum film in the second opening portion; forming a mask and mark on the aluminum film by common lithography process, the mask being an etching mask for forming the aluminum wiring, the mark being an alignment mark for aligning the connection hole with the aluminum wiring; determining amount of misalignment of the connection hole with the aluminum wiring based on the mark and the concave portion; and forming the aluminum wiring by etching the aluminum film using the etching mask as a mask when the amount of the misalignment is within an allowable range.

DETAILED DESCRIPTION OF THE INVENTION

One embodiment of the present invention will be hereinafter described with reference to the accompanying drawings.

At first, a problem of process for a NAND flash type memory comprising multilayer wiring including a Cu wiring found out by the present inventors will be hereinafter described.

In the multilayer wiring of the NAND flash type memory, an Al wiring is used as the uppermost layer from a viewpoint of cost reduction. The Al wiring and a Cu wiring formed under the Al wiring are connected via an Al plug.

This kind of Al wiring and Al plug is collectively formed on the Cu wiring layer using reflow aluminum sputtering technique. The process for forming the Al wirings and Al plug is carried out in the following manner.

Figure 10:
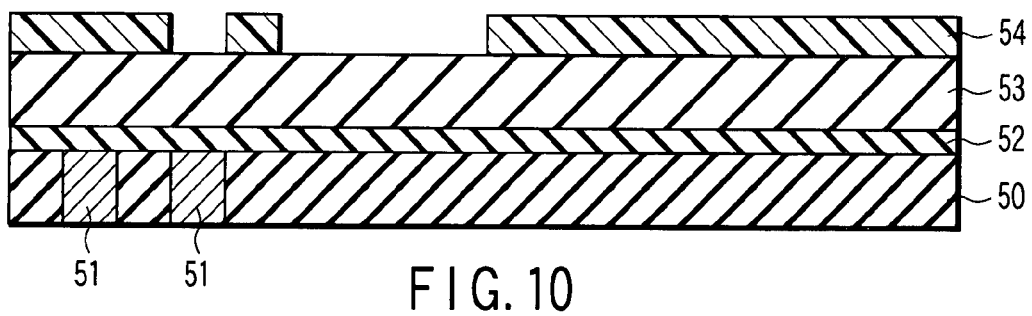
FIG. 10 is a cross-sectional view for explaining a problem of process for a NAND flash type memory comprising multilayer wiring including a Cu wiring found out by the present inventors.

First, as shown in FIG. 10, a silicon nitride film 52 for preventing Cu diffusion is formed on the cu wiring layer by damascene process. The cu wiring layer comprises an interlayer insulating film 50 and cu wiring 51.

Next, a SiO$_2$ system interlayer insulating film 53 is formed on the silicon nitride film 52, thereafter, a resist pattern 54 for forming a connection hole (via hole) and an opening portion which are used for alignment is formed in the interlayer film 53.

Figure 11:
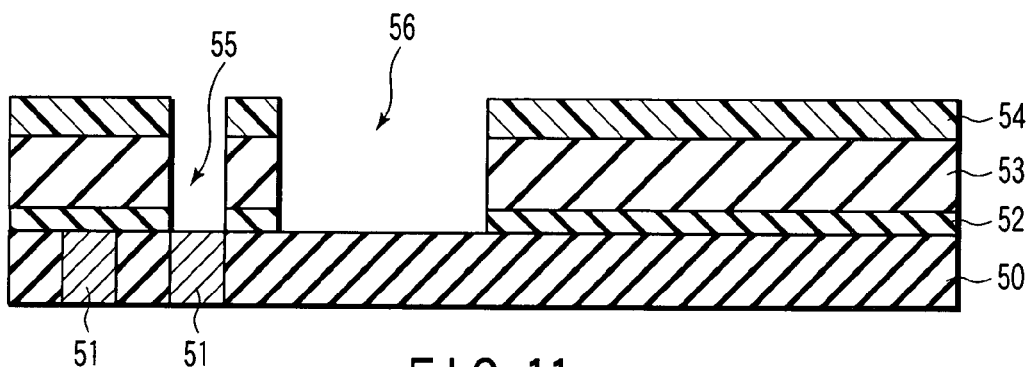
FIG. 11 is a cross-sectional view for explaining the problem of the process following FIG. 10.

Next, as shown in FIG. 11, the interlayer insulating film 53 is etched using the resist pattern 54 as a mask, and further, the silicon nitride film 52 under the interlayer insulating film 53 is etched, and thereby, the connection hole 55 and the opening portion 56 are formed.

Figure 12:
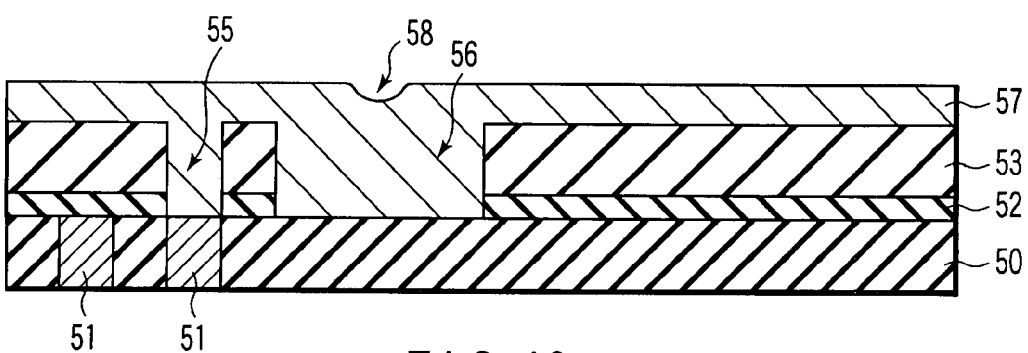
FIG. 12 is a cross-sectional view for explaining the problem of the process following FIG. 11.

Next, as shown in FIG. 12, an Al film 57 is formed on the entire surface by reflow sputtering process at the film forming temperature of 400° C. or higher to fill the connection hole 55 with the Al film 56. On the other hand, as the opening portion 56 has a larger diameter than the connection hole 55, the opening portion 56 is filled with the Al film 57 up to intermediate depth of the opening portion 56, so that the depth of the opening portion 56 becomes shallow. As a result, the depth of a concave portion 58 (step of portion) formed on the opening portion 56 and on a surface of the Al film 57 peripheral to the opening portion 56 becomes shallow (small). Therefore, a detection signal from a region including the concave portion 58 becomes weak at a time alignment, so that it becomes difficult to secure alignment accuracy.

Figure 13:
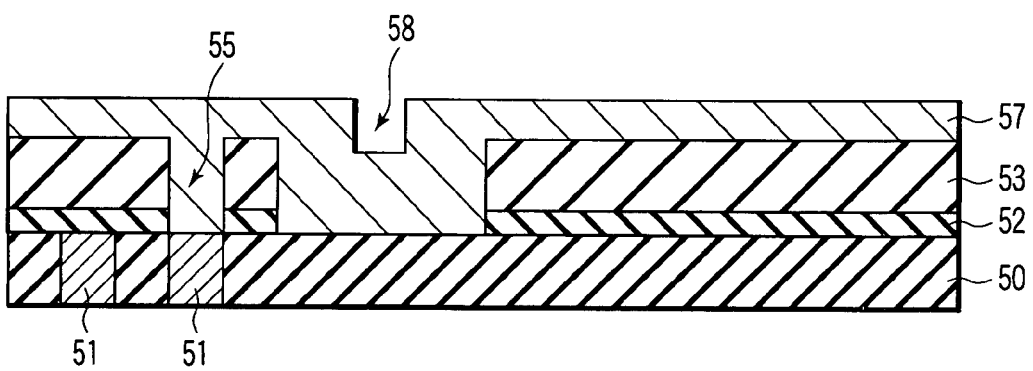
FIG. 13 is a cross-sectional view for explaining a method for solving the problem of the process.

The foregoing disadvantage is solved by removing the Al film 57 of specific portions in the opening portion 56 to deepen the concave portion 58 as shown in FIG. 13. However, the additional process for removing the Al film 57 raises the cost, as a result, the Al wiring which is introduced from the point of cost reduction becomes less effective.

An embodiment considering the foregoing problem will be hereinafter described with reference to figures.

FIGS. 1 to 8 are cross-sectional views showing a method for manufacturing a semiconductor device according to the embodiment;

[FIG. 1]

Figure 1:
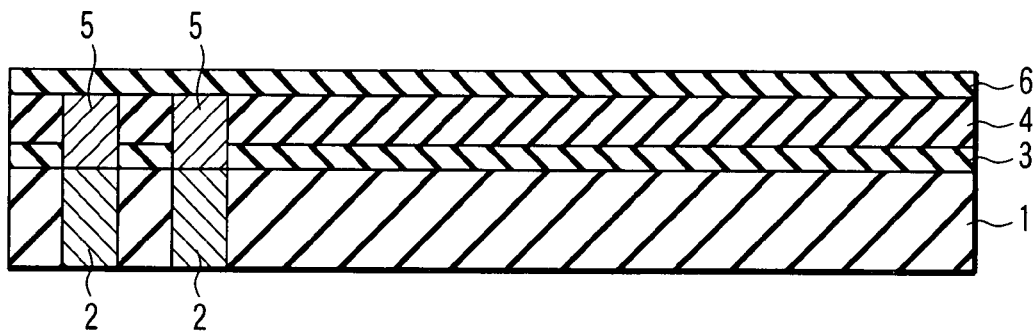
FIG. 1 is a cross-sectional view showing a method for manufacturing a semiconductor device according to an embodiment.
Figure 2:
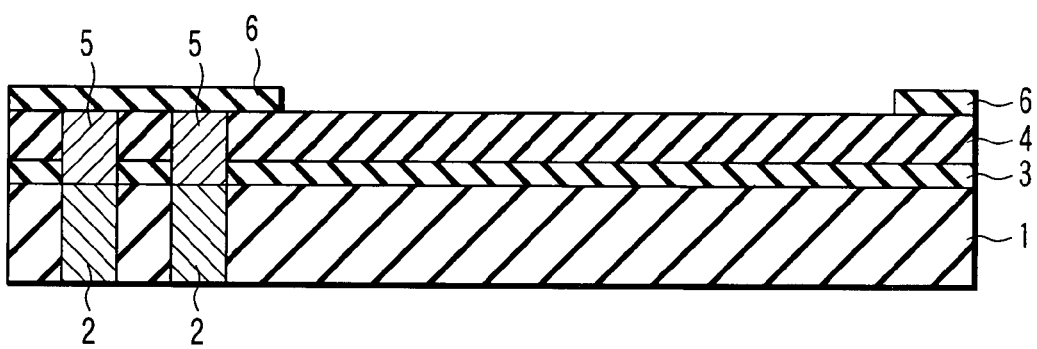
FIG. 2 is a cross-sectional view showing the method for manufacturing the semiconductor device according to the embodiment following FIG. 1.
Figure 3:
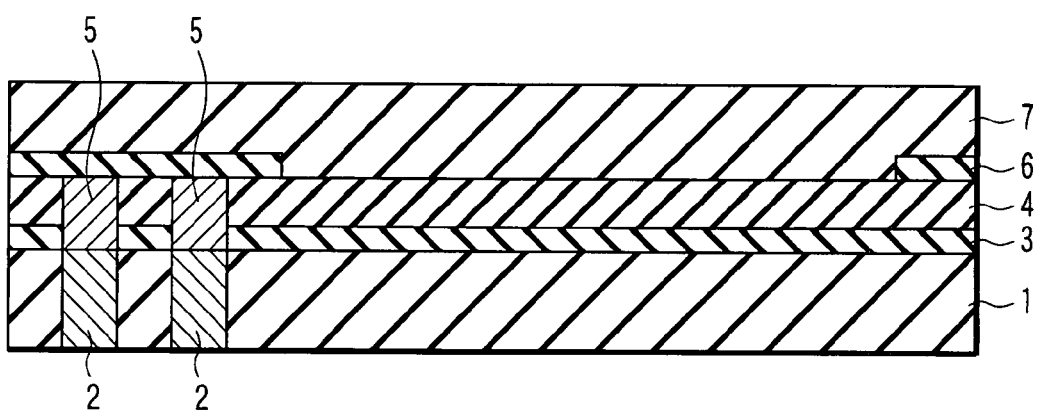
FIG. 3 is a cross-sectional view showing the method for manufacturing the semiconductor device according to the embodiment following FIG. 2.
Figure 4:
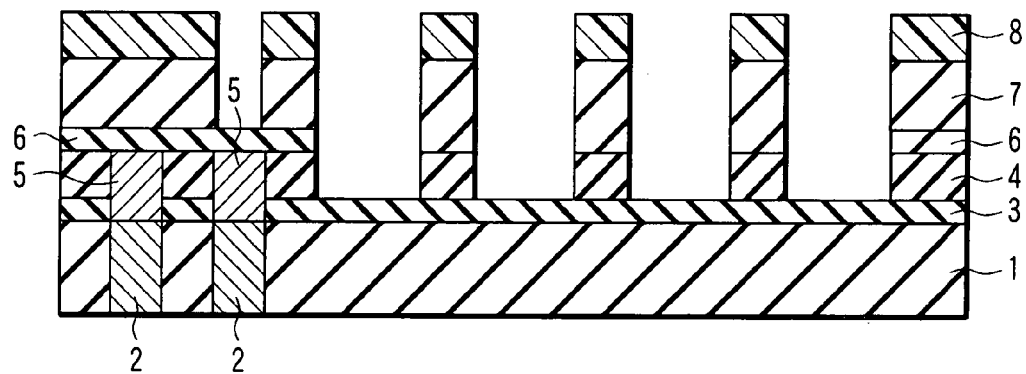
FIG. 4 is a cross-sectional view showing the method for manufacturing the semiconductor device according to the embodiment following FIG. 3.

In FIG. 1, there is shown a Cu trench wiring layer (Cu damascene wiring) formed on a semiconductor substrate comprising a non-volatile semiconductor memory such as NAND type flash memory cell (not shown). This Cu trench wiring layer comprises a SiO$_2$ system interlayer insulating film 1 (first insulating film) such as TEOS film and Cu wiring 5 formed in the interlayer insulating film 1.

The Cu wiring 5 is connected to a lower-layer conductive region (e.g., lower-layer wiring or diffusion layer) (not shown) via a plug 2. In FIG. 1, a reference numeral 4 denotes SiO$_2$ system interlayer insulating film such as TEOS film, 3 denotes a silicon nitride film as a stopper film, 6 denotes a silicon nitride film as a cap insulating film (Cu anti-diffusion film). The silicon oxide film is also usable as the cap insulating film (Cu anti-diffusion film).

The structure shown in FIG. 1 is formed by known process. Briefly explaining, at first, the SiO$_2$ system interlayer insulating film 1 is deposited on a semiconductor substrate such as silicon substrate. Thereafter, a connection hole is opened in the SiO$_2$ system interlayer insulating film 1.

Next, a barrier metal film (e.g., a single layer film of titanium nitride film or stacked layer of titanium film/titanium nitride film) is deposited so that the inner surface of the connection hole is covered with the barrier metal film, then, a tungsten film is deposited on the barrier metal film so that the connection hole is filled with the tungsten film, thereafter, by CMP (Chemical Mechanical Polishing) process, the barrier metal film and the tungsten film out of the connection hole are removed to planarize the surface. As a result, a plug 2 formed of the tungsten film, whose bottom and side are covered with the barrier metal film, is obtained.

Next, the silicon nitride film 3 (35 nm of thickness for instance) is deposited by plasma CVD process, then, the SiO$_2$ system interlayer insulating film 4 (100 nm of thickness for instance) is deposited on the silicon nitride film 3, thereafter, an wiring trench is formed in the silicon nitride film 3 and SiO$_2$ system interlayer insulating film 4.

Next, by deposition of a Cu film and CMP of the Cu film, the Cu wiring 5 is formed in the wiring trench. More specifically, the barrier metal film is deposited before the Cu film is deposited, however, it is omitted in FIG. 1. Thereafter, the silicon nitride film (50 nm of thickness for instance) is deposited, and thereby, the structure shown in FIG. 1 is obtained.

[FIG. 2]

Next, by ablation, a part of the silicon nitride film (second insulating film) is removed, so that an opening portion (first opening portion) is formed in the silicon nitride film 6. The first opening portion is formed in a region corresponding to an alignment region used in the lithography process (FIG. 7) for forming Al wiring on the Cu trench wiring layer. The alignment region includes concave portion 10' and alignment marks 12b in FIG. 7. In addition, no Cu wiring 5 exist under the opening portion.

The conditions of the laser ablation are as follows. That is, a pulse width is 30 nsec or less in an ultraviolet area of laser wavelength 400 nm or less, energy density (fluence) per unit area ranges from 0.5 to 2.0 J/cm$^2$. As the laser, for example, YAG laser having solid oscillation source is given.

In addition, in order to prevent the silicon nitride film 6 (scattered substance due to the processing) from remaining on a wafer, a soluble protective film is applied on the silicon nitride film 6 before laser irradiation, and then cleaning may be performed after the laser irradiation.

Here, as the soluble protective film, a film forming of poly acrylate acid is given for instance. As the material of the soluble protective film, in general, it is preferable to use the material having transmittance higher than the film to be processed (here, silicon nitride film 6) in the using laser wavelength. By using the protective film having higher transmittance, the protective film does not almost absorb laser beam, and then heat from the protective film itself is low. Therefore, the protective film which is not decomposed at the time of light irradiation, scatters around the processing region in a solid state without being melted. The solid-state protective film scattered around the processing region is quickly removed by cleaning performed after the processing. Further, as the protective film is soluble, it is possible to perform the process for removing the protective film at relatively low cost.

The removal of the silicon nitride film 6 (formation of opening portion) is also performed by using lithography process and etching process, however, the laser ablation of the embodiment results in less manufacturing cost.

[FIG. 3]

Next, a $SiO_2$ system interlayer insulating film 7 (300 nm of thickness for instance) such as TEOS film is deposited on the entire surface. Here, the silicon nitride film 6 does not exit on the bottom of the first opening portion. Therefore, the surface of the first opening portion is formed slightly lower than the surface of the deposited $SiO_2$ interlayer insulating film 7, however, In FIG. 3, the foregoing state is not illustrated for simplicity. By the same token, resist pattern 8, Al film 11 and resist film to be processed into the alignment marks 12b, which are formed at the later step, becomes slight lower in the first opening portion.

[FIG. 4]

Next, a resist pattern 8 is formed on the interlayer insulating film 7. The resist pattern 8 includes an opening pattern corresponding to a connection hole (via hole) for electrically connecting Cu wiring 5 and Al wiring. Further, the resist pattern 8 includes an opening pattern corresponding to a concave portion for alignment.

Next, the interlayer insulating films 7 and 4 are successively etched by RIE (Reactive Ion Etching) process using the resist pattern 8 as a mask. The RIE process is carried out under the condition that the etching rate of interlayer insulating film 4 and 7 (silicon oxide film) is larger than that of the silicon nitride films 6 and 3.

In this manner, an opening portion (second opening portion), which reaches the rear surface of the interlayer insulating film 4 from the interlayer insulating film 7 via the opening portion (first opening portion) of the silicon nitride film 6, is formed. On the other hand, an opening portion (third opening portion) is formed in the interlayer insulating film 7 on the Cu wiring 5.

[FIG. 5]

Next, in a case of removal of the resist pattern 8 by ashing, and the cleaning is carried out by wet treatment. Thereafter, exposed silicon nitride films 3 and 6 are removed by etch back. The etch back is carried out under the condition that the etching rate of silicon nitride films 3 and 6 is larger than that of the interlayer insulating film 1 (silicon oxide film).

As a result, a connection hole 9 for connecting Cu wiring 5 and Al wiring is formed in the silicon nitride film 6 and the interlayer insulating film 7, moreover, an opening portion 10 is formed in the interlayer insulating film 7, silicon nitride film 6, interlayer insulating film 4 and silicon nitride film 3. The width W of the opening portion 10 is about a few tens of μm. The dimension of the opening portion 10 has a few hundreds of μm in the depth direction in FIG. 5.

Figure 5:
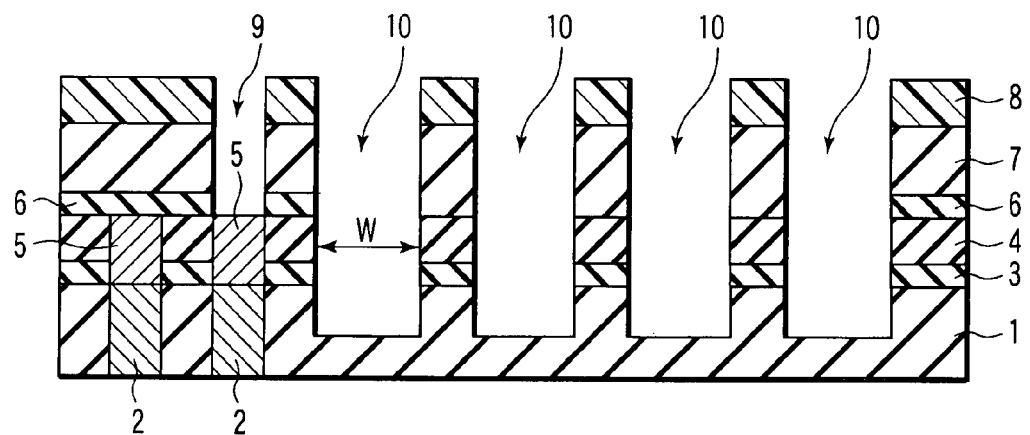
FIG. 5 is a cross-sectional view showing the method for manufacturing the semiconductor device according to the embodiment following FIG. 4.
Figure 6:
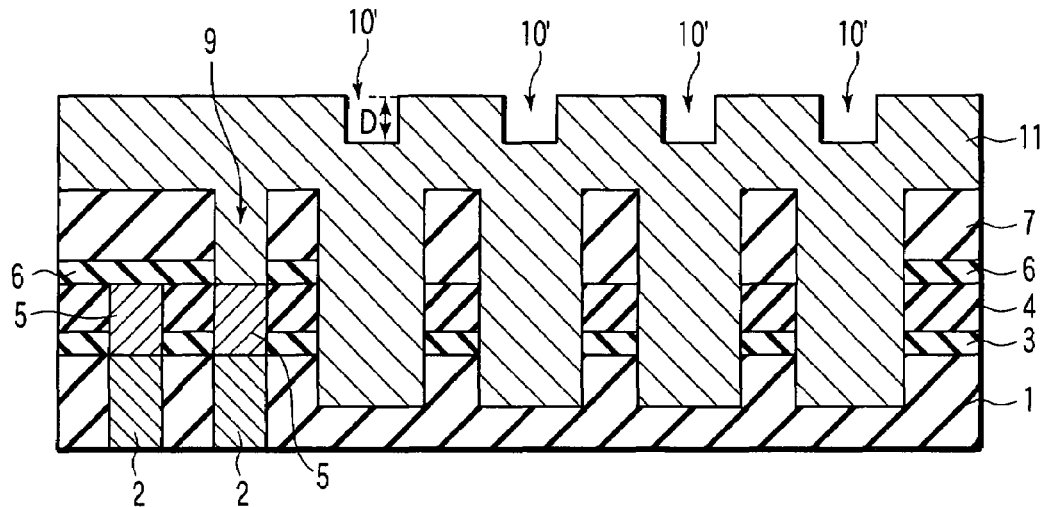
FIG. 6 is a cross-sectional view showing the method for manufacturing the semiconductor device according to one embodiment following FIG. 5.
Figure 7:
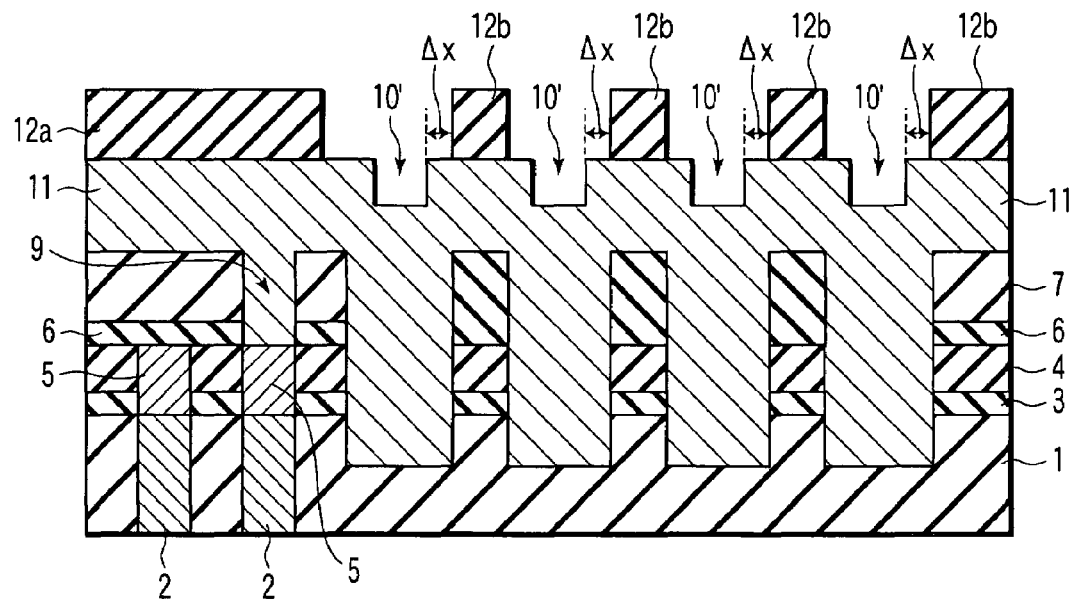
FIG. 7 is a cross-sectional view showing the method for manufacturing the semiconductor device according to one embodiment following FIG. 6.

Here, the depth of the opening portion 10 is, for example, about 485 nm (=300 nm (thickness of interlayer insulating film 7)+50 nm (thickness of silicon nitride film 6)+100 nm (thickness of interlayer insulating film 4)+35 nm (thickness of silicon nitride film 3)). In this way, according to the present embodiment, a deep opening portion 10 (having high aspect ratio) is obtained. In fact, when etch back is carried out, the interlayer insulating film 1 under the opening portion 10 is etched to some degree (e.g., a few tens of nm). In FIG. 5, the foregoing state is illustrated.

[FIG. 6]

Al film 11 functioning to be processed into Al wiring and Al plug is formed on the entire surface by reflow aluminum sputtering technique.

Here, if the thickness of the Al film 11 exceeds 1000 nm, it becomes difficult to carry out dry etching (e.g., Al-RIE etching) using a resist as a mask. Therefore, the film thickness of the Al film 11 is less than 1000 nm, for example, set to 700 to 800 nm. In addition, the formation temperature of the Al film 11 is set 450° C. or less. If the formation temperature exceeds 450° C., Al is melted, so that it becomes difficult to form the Al film 11.

In a case of the present embodiment, as the opening portion 10 is deep (high aspect ratio) before the Al film 11 is formed, the depth D (step) of the opening portion 10 (concave portion 10') is easily set to 100 nm after the Al film 11 is formed. Thereby, a detection signal corresponding to misalignment amount detected at time of alignment becomes strong.

In addition, in a case of the present embodiment, the depth of the concave portion 10' is made deep without etching the Al film 11. Deeping the depth of the concave portion 10' by etching the Al film 11 causes increasing of cost. Therefore, according to the present embodiment, the const is prevented from increasing, and the depth D of the concave portion 10' is made deep.

[FIG. 7]

Next, a resist film is applied on the Al film 11, and then, exposure and development are performed to the resist film, thereby a resist pattern 12a for forming a Al wiring and a plurality of alignment marks 12b are formed. Here, the number of alignment mark 12b is plural, but, one may be given. The alignment marks 12b are formed on a dicing line.

Next, for each of the plurality of alignment marks 12b, distance Δx between the alignment mark 12b and the edge of the concave portion 10' is detected by known detection method, for example, the method using CCD camera, and then, an average value of the distances Δx is employed as the amount of misalignment between the connection hole 9 and the resist pattern 12a. As the concave portion 10' is deep, detection signal corresponding to the distance Δx is strong.

Here, the resist pattern 12a and the alignment marks 12b are formed by lithography process in the same step, and the connection hole 9 and the opening portion 10 are formed by lithography process and etching process in the same step. Therefore, misalignment (Δx) between the alignment mark 12b and the concave portion 10' directly corresponds to the misalignment between the resist pattern 12a and the connection hole 9. Therefore, according to present embodiment, misalignment is high accurately measured. This serves to reduce the manufacturing cost.

[FIG. 8]

Next, it is judged whether the amount of the misalignment is within an allowable range or not.

As a result of the judgment, if the amount of the misalignment is within an allowable range, an Al-RIE process is carried out using the resist pattern 12a as a mask to form Al wiring and plug 11a. At this time, the alignment marks 12b are also used as the mask, therefore, an Al pattern 11b corresponding to the alignment marks 12b is formed. In FIG. 11, a reference numeral 11c denotes an Al film (residual Al film) which remains in the concave portion 10' without being etched. The Al pattern 11b and residual Al film 11c are removed in a wafer dicing step.

On the other hand, if the amount of the misalignment is out of an allowable range, the resist pattern 12a and the alignment marks 12b are removed, and then, the step of forming the resist pattern 12a and the alignment marks 12b of FIG. 7 are carried out again. The step of forming the resist pattern 12*a* and the alignment marks 12*b* is repeatedly carried out until the amount of the misalignment is within the allowable range.

Figure 8:
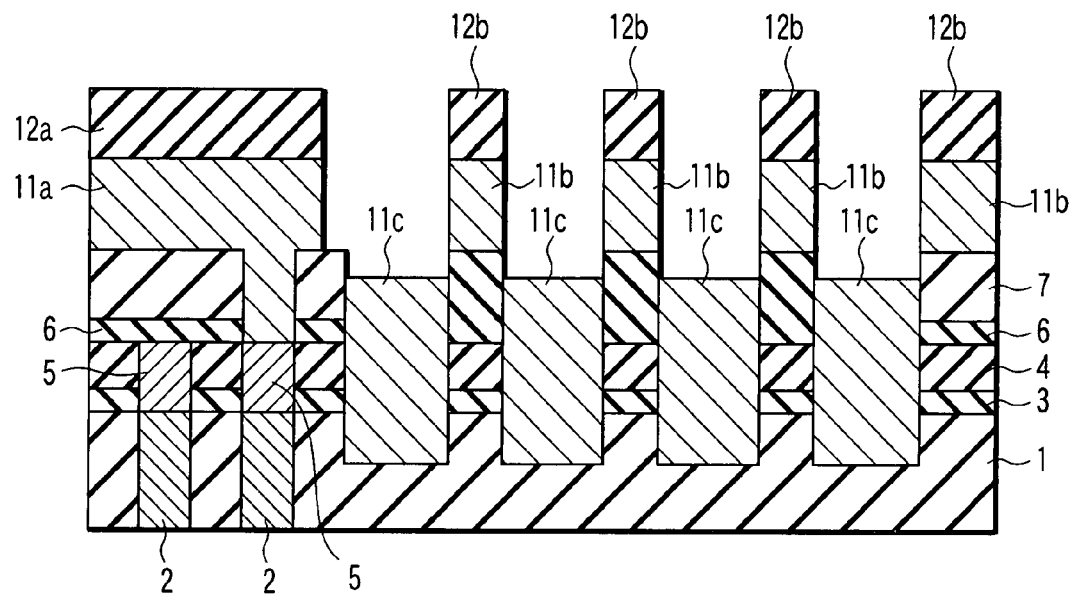
FIG. 8 is a cross-sectional view showing the method for manufacturing the semiconductor device according to the embodiment following FIG. 7.

After the step of FIG. 8, a step of removing the resist pattern 12*a* and the alignment marks 12*b* is carried out, further, well known steps such as deposition step of a passivation film, dicing of the wafer and the like are carried out.

Figure 9:
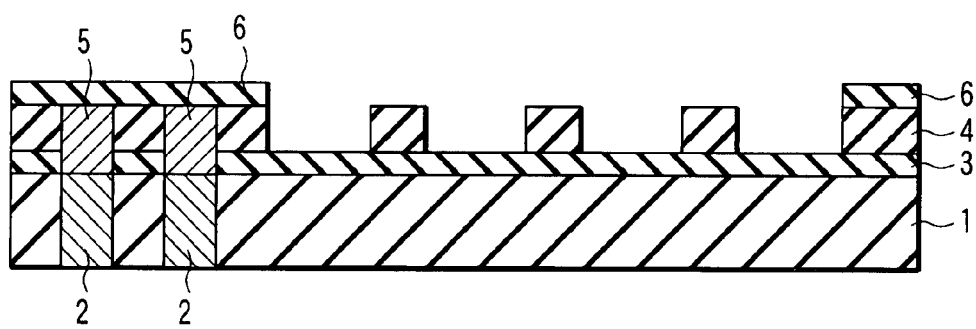
FIG. 9 is a cross-sectional view showing a modification example of the process shown in FIG. 2.

The present invention is not limited to the foregoing embodiment. For example, in the step of FIG. 2, the region of the silicon nitride film 6 where the opening portion 10 is to be formed is removed by laser ablation, however, as shown in FIG. 9, the interlayer insulating film 4 under the removed silicon nitride film 6 may be further removed.

According to the foregoing embodiment, the multilayer wiring layer including the Cu trench wiring layer and the Al wiring layer of the NAND type flash memory is given as an example for explanation, the present invention is applicable to a multilayer wiring layer the including Cu trench wiring and the Al wiring layer of other non-volatile semiconductor memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device including a copper trench wiring layer and an aluminum wiring formed on the copper trench wiring layer by a lithography process using an alignment region, the method comprising:
   forming a copper anti-diffusion film on the copper trench wiring layer; and
   forming an opening portion in the copper anti-diffusion film by laser ablation, the opening portion being formed in a region corresponding to the alignment region used for the lithography process for forming the aluminum wiring on the copper trench wiring layer.

2. A method for manufacturing a semiconductor device comprising:
   forming a copper anti-diffusion film on a copper trench wiring layer, the copper trench wiring layer comprising a first insulating film and a copper wiring formed in the first insulating film;
   forming a first opening portion in the copper anti-diffusion film by laser ablation;
   forming a second insulating film on the copper anti-diffusion film and the first opening portion;
   forming a second opening portion reaching a rear surface of the first insulating film from a surface of the second insulating film via the first opening portion and forming a third opening portion in the second insulating film on the copper wiring by etching the second and first insulating films successively;
   forming a connection hole to the copper trench wiring layer in the second insulating film and the copper anti-diffusion film by etching the copper anti-diffusion film under a bottom of the third opening portion;
   forming an aluminum film to be processed into an aluminum wiring and an aluminum plug on the connection hole, the second opening portion and the second insulating film so that a concave portion is formed on a surface of the aluminum film in the second opening portion;
   forming a mask and mark on the aluminum film by common lithography process, the mask being an etching mask for forming the aluminum wiring, the mark being an alignment mark for aligning the connection hole with the aluminum wiring;
   determining amount of misalignment of the connection hole with the aluminum wiring based on the mark and the concave portion; and
   forming the aluminum wiring by etching the aluminum film using the etching mask as a mask when the amount of the misalignment is within an allowable range.

3. The method according to claim 1, wherein a film thickness of the aluminum film is 1000 nm or less, and a formation temperature of the aluminum film is 450° C. or less.

4. The method according to claim 1, wherein the forming the opening portion by the laser ablation is carried out under condition that laser wavelength is in an ultraviolet region of 400 nm or less, pulse width is 30 nsec or less, and energy density per unit area ranges from 0.5 to 2.0 J/cm$^2$.

5. The method according to claim 2, wherein the forming the opening portion by the laser ablation is carried out under condition that laser wavelength is in an ultraviolet region of 400 nm or less, pulse width is 30 nsec or less, and energy density per unit area ranges from 0.5 to 2.0 J/cm$^2$.

6. The method according to claim 3, wherein the forming the opening portion by the laser ablation is carried out under condition that laser wavelength is in an ultraviolet region of 400 nm or less, pulse width is 30 nsec or less, and energy density per unit area ranges from 0.5 to 2.0 J/cm$^2$.

7. The method according to claim 4, further comprising:
   forming a soluble protective film on the copper anti-diffusion film before the forming the opening portion by the laser ablation; and
   removing the protective film for cleaning after the forming the opening portion by the laser ablation.

8. The method according to claim 5, further comprising:
   forming a soluble protective film on the copper anti-diffusion film before the forming the opening portion by the laser ablation; and
   removing the protective film for cleaning after the forming the opening portion by the laser ablation.

9. The method according to claim 6, further comprising:
   forming a soluble protective film on the copper anti-diffusion film before the forming the opening portion by the laser ablation; and
   removing the protective film for cleaning after the forming the opening portion by the laser ablation.

10. The method according to claim 2, wherein the first and second insulating films are interlayer insulating films.

11. The method according to claim 10, wherein the interlayer insulating films are $SiO_2$ system insulating films.

12. The method according to claim 11, wherein the $SiO_2$ system insulating films are TEOS films.

* * * * *